US012635517B2

(12) United States Patent
Yang et al.

(10) Patent No.: US 12,635,517 B2
(45) Date of Patent: May 19, 2026

(54) DUAL-SIDE HEAT-DISSIPATION PACKAGE STRUCTURE AND PACKAGE STRUCTURE

(71) Applicant: TONG HSING ELECTRONIC INDUSTRIES, LTD., Taipei City (TW)

(72) Inventors: Ting-An Yang, Taipei City (TW); Chi-Wen Huang, Taipei City (TW)

(73) Assignee: TONG HSING ELECTRONIC INDUSTRIES, LTD., Taipei City (TW)

( * ) Notice: Subject to any disclaimer, the term of this patent is extended or adjusted under 35 U.S.C. 154(b) by 379 days.

(21) Appl. No.: 18/423,499

(22) Filed: Jan. 26, 2024

(65) Prior Publication Data

US 2025/0157873 A1      May 15, 2025

(30) Foreign Application Priority Data

Nov. 13, 2023     (TW) ................................. 112143573

(51) Int. Cl.
| | |
|---|---|
| *H10W 40/22* | (2026.01) |
| *H10W 40/25* | (2026.01) |
| *H10W 72/30* | (2026.01) |
| *H10W 72/90* | (2026.01) |
| *H10W 74/00* | (2026.01) |
| *H10W 74/10* | (2026.01) |

(52) U.S. Cl.
CPC ......... *H10W 40/22* (2026.01); *H10W 40/258* (2026.01); *H10W 74/114* (2026.01); *H10W 72/321* (2026.01); *H10W 72/342* (2026.01); *H10W 72/921* (2026.01); *H10W 72/923* (2026.01); *H10W 72/9415* (2026.01); *H10W 74/00* (2026.01)

(58) Field of Classification Search
None
See application file for complete search history.

(56) References Cited

U.S. PATENT DOCUMENTS

| | | | |
|---|---|---|---|
| 2005/0036291 A1* | 2/2005 | Huang ................... | H10W 40/43 |
| | | | 257/E21.503 |
| 2006/0081978 A1* | 4/2006 | Huang ................... | H10W 40/22 |
| | | | 257/E23.105 |
| 2010/0041181 A1* | 2/2010 | Huang ................... | H10W 40/22 |
| | | | 257/E21.599 |
| 2013/0016477 A1* | 1/2013 | Yokoya ................. | H10W 40/10 |
| | | | 438/122 |
| 2020/0235026 A1* | 7/2020 | Kurokawa ........... | H10D 10/821 |

* cited by examiner

*Primary Examiner* — Khaja Ahmad
(74) *Attorney, Agent, or Firm* — Li & Cai Intellectual Property (USA) Office

(57)      ABSTRACT

A package structure includes a board, an inner metal layer, a metal piece, and a buffering conductor. The inner metal layer is disposed on an inner side of the board and includes a connection region. The metal piece has a first segment being spaced apart from and facing toward the connection region. The first segment and the connection segment have uneven surfaces that are complement in shape with each other and that have a gap there-between. The buffering conductor is arranged in the gap, and connects the first segment and the connection segment to be jointly formed as an expansion joint. The buffering conductor has a coefficient of thermal expansion (CTE) that is less than a CTE of the inner metal layer and that is less than a CTE of the metal piece.

20 Claims, 12 Drawing Sheets

DUAL-SIDE HEAT-DISSIPATION PACKAGE STRUCTURE AND PACKAGE STRUCTURE

CROSS-REFERENCE TO RELATED PATENT APPLICATION

This application claims the benefit of priority to Taiwan Patent Application No. 112143573, filed on Nov. 13, 2023. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a package structure, and more particularly to a dual-side heat-dissipation package structure and a package structure each having an expansion joint embedded therein.

BACKGROUND OF THE DISCLOSURE

In a conventional package structure, a connection interface between any two components embedded in an encapsulant is easily affected by thermal expansion and contraction, such that the connection interface easily generates defects (e.g., a delamination or a crack).

SUMMARY OF THE DISCLOSURE

In response to the above-referenced technical inadequacies, the present disclosure provides a dual-side heat-dissipation package structure and a package structure for effectively improving on the issues associated with conventional package structures.

In order to solve the above-mentioned problems, one of the technical aspects adopted by the present disclosure is to provide a dual-side heat-dissipation package structure, which includes a first heat-dissipation board, at least one chip, a second heat-dissipation board, and at least one first buffering conductor. The first heat-dissipation board includes a first board and a first inner metal layer that is disposed on an inner side of the first board. The first inner metal layer includes at least one chip-bonding region and at least one first supporting pillar. The at least one chip is disposed on the at least one chip-bonding region. The second heat-dissipation board includes a second board and a second inner metal layer that is disposed on an inner side of the second board. The second inner metal layer includes at least one positioning region and at least one second supporting pillar. The at least one positioning region is sandwiched between the at least one positioning region and the at least one chip-bonding region. The at least one second supporting pillar has an end that is spaced apart from and faces toward an end of the at least one first supporting pillar along a thickness direction. The end of the at least one first supporting pillar and the end of the at least one second supporting pillar have uneven surfaces that are complementary in shape with each other and that have a first gap therebetween. The at least one first buffering conductor is arranged in the first gap and connects the end of the at least one first supporting pillar and the end of the at least one second supporting pillar so as to be jointly defined as at least one first expansion joint. The at least one first buffering conductor has a coefficient of thermal expansion (CTE) that is less than a CTE of the first inner metal layer and that is less than a CTE of the second inner metal layer.

In order to solve the above-mentioned problems, another one of the technical aspects adopted by the present disclosure is to provide a dual-side heat-dissipation package structure, which includes two heat-dissipation boards, a chip, and a buffering conductor. The two heat-dissipation boards are spaced apart from each other along a thickness direction and respectively have two supporting pillars. Ends of the two supporting pillars are spaced apart from and face toward each other along the thickness direction, and the ends of the two supporting pillars have uneven surfaces that are complementary in shape with each other and that have a gap therebetween. The chip is arranged between the two heat-dissipation boards and has a chip coefficient of thermal expansion (CTE). The buffering conductor is arranged in the gap and connects the ends of the two supporting pillars so as to be jointly defined as an expansion joint. The buffering conductor has a CTE that is less than or equal to 250% of the chip CTE.

In order to solve the above-mentioned problems, yet another one of the technical aspects adopted by the present disclosure is to provide a package structure, which includes a metal layer including a connection region, a metal piece, and a buffering conductor. The metal piece has a first segment that faces toward the connection region along a thickness direction. The first segment and the connection region have uneven surfaces that are complementary in shape with each other and that have a gap therebetween. The buffering conductor is arranged in the gap and connects the first segment and the connection region so as to be jointly defined as an expansion joint. The buffering conductor has a coefficient of thermal expansion (CTE) that is less than a CTE of the metal layer and that is less than a CTE of the metal piece.

Therefore, two corresponding components arranged in the dual-side heat-dissipation package structure (or the package structure) and connected to each other (or having a connection requirement), which are provided by the present disclosure, have uneven surfaces that are complementary in shape with each other and are connected through the buffering conductor having a specific CTE, such that the buffering conductor can be provided with a stress buffering function, an electrically conductive function, and a transmission function for effectively improving connection issues between the two corresponding components (e.g., a delamination defect, a peeling defect, or a crack defect) due to thermal expansion and contraction.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
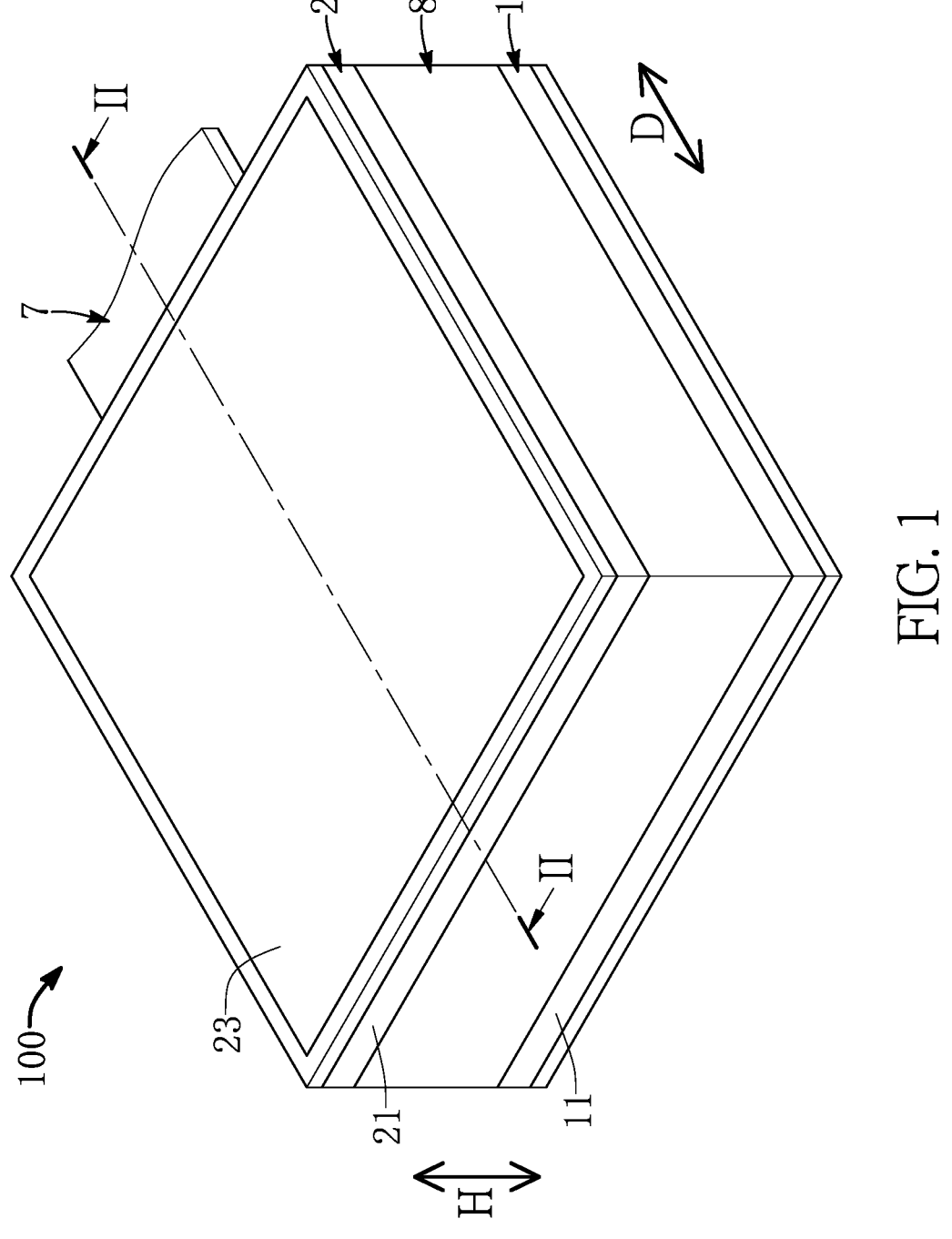
FIG. 1 is a schematic perspective view of a dual-side heat-dissipation package structure according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a," "an" and "the" includes plural reference, and the meaning of "in" includes "in" and "on." Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first," "second" or "third" can be used to describe various components, signals or the like, which are for distinguishing one component/signal from another one only, and are not intended to, nor should be construed to impose any substantive limitations on the components, signals or the like.

First Embodiment

Referring to FIG. 1 to FIG. 6, a first embodiment of the present disclosure is provided. As shown in FIG. 1 to FIG.

3, the present embodiment provides a dual-side heat-dissipation package structure 100, which includes a first heat-dissipation board 1, a second heat-dissipation board 2 facing toward the first heat-dissipation board 1, at least one chip 3 arranged between the first heat-dissipation board 1 and the second heat-dissipation board 2, at least one first buffering conductor 4 arranged between the first heat-dissipation board 1 and the second heat-dissipation board 2, a buffering conductive layer 5 connected to the at least one chip 3 and the second heat-dissipation board 2, a second buffering conductor 6 disposed on the first heat-dissipation board 1, a metal piece 7 fixed to the second buffering conductor 6, and an encapsulant 8 that is formed on the first heat-dissipation board 1 and the second heat-dissipation board 2.

It should be noted that the dual-side heat-dissipation package structure 100 in the present embodiment is described by including the above components, but the present disclosure is not limited thereto. For example, in other embodiments of the present disclosure not shown in the drawings, at least one of the buffering conductive layer 5, the second buffering conductor 6, the metal piece 7, and the encapsulant 8 in the dual-side heat-dissipation package structure 100 can be omitted according to design requirements. Moreover, each of a quantity of the at least one first buffering conductor 4 and a quantity of the at least one chip 3 in the present embodiment is more than one, but the present disclosure is not limited thereto.

Each of the chips 3 has a chip coefficient of thermal expansion (CTE) that can be within a range from 3 to 5, and any one of the chips 3 in the present embodiment can be a silicon carbide (SiC) chip or a gallium nitride (GaN) chip, and the second chip 3 can be a metal oxide semiconductor field effect transistor (MOSFET) chip, but the present disclosure is not limited thereto.

The first heat-dissipation board 1 includes a first board 11, a first inner metal layer 12 disposed on an inner side of the first board 11, and a first outer metal layer 13 that is disposed on an outer side of the first board 11. The shape or structure of the first inner metal layer 12 can be adjusted or changed according to design requirements. In the present embodiment, the first inner metal layer 12 includes at least one chip-bonding region 121, at least one first supporting pillar 122, and a connection region 123.

Specifically, the at least one chip-bonding region 121 has a thin sheet shape and allows the at least one chip 3 to be disposed thereon, such that a quantity of the at least one chip-bonding region 121 is preferably equal to (or not less than) the quantity of the at least one chip 3. Each of the chips 3 is preferably connected to the corresponding chip-bonding region 121 through a conductive adhesive (not labeled in the drawings), but the present disclosure is not limited thereto. Moreover, a quantity of the at least one first supporting pillar 122 can be more than one, the first supporting pillars 122 are spaced apart from each other, and the connection region 123 is arranged on an outer portion of the first inner metal layer 12.

The second heat-dissipation board 2 includes a second board 21, a second inner metal layer 22 disposed on an inner side of the second board 21, and a second outer metal layer 23 that is disposed on an outer side of the second board 21. The shape or structure of the second inner metal layer 22 can be adjusted or changed according to design requirements. In the present embodiment, the second inner metal layer 22 includes at least one positioning region 221 and at least one second supporting pillar 222.

Specifically, the first heat-dissipation board 1 and the second heat-dissipation board 2 are spaced apart from each other along a thickness direction H, and the at least one chip 3 is sandwiched between the at least one positioning region 221 having a pillar shape and the at least one chip-bonding region 121 (e.g., the at least one chip 3 is sandwiched between the first heat-dissipation board 1 and the second heat-dissipation board 2), such that a quantity of the at least one positioning region 221 is preferably not less than the quantity of the at least one chip 3.

Moreover, a quantity of the at least one second supporting pillar 222 in the present embodiment is more than one. The second supporting pillars 222 are spaced apart from each other, and an end 2221 of each of the second supporting pillars 222 is spaced apart from and faces toward an end 1221 of one of the first supporting pillars 122 along the thickness direction H. The end 1221 of each of the first supporting pillar 122 and the end 2221 of the corresponding second supporting pillar 222 have uneven surfaces that are complementary in shape with each other and that have a first gap therebetween.

It should be noted that each of the first heat-dissipation board 1 and the second heat-dissipation board 2 is preferably a direct bonded copper (DBC) ceramic substrate. In other words, each of the first board 11 and the second board 21 is a ceramic board, the first inner metal layer 12 is sintered and fixed to the first board 11, and the second inner metal layer 22 is sintered and fixed to the second board 21.

In addition, each of the first heat-dissipation board 1 and the second heat-dissipation board 2 can be an active metal brazing (AMB) ceramic substrate. Specifically, each of the first board 11 and the second board 21 is a ceramic board, the first inner metal layer 12 is brazed and fixed to the first board 11, and the second inner metal layer 22 is brazed and fixed to the second board 21.

Each of the first buffering conductors 4 is arranged in one of the first gaps and connects the end 1221 of the corresponding first supporting pillar 122 and the end 2221 of the corresponding second supporting pillar 222 so as to be jointly defined as a first expansion joint J1. Any two of the chips 3 are preferably provided with one of the first expansion joints J1 therebetween along a transverse direction D perpendicular to the thickness direction H. It should be noted that as the first expansion joints J1 in the dual-side heat-dissipation package structure 100 are of substantially the same or similar structure, the following description discloses the structure of just one of the first expansion joints J1 for the sake of brevity, but the present disclosure is not limited thereto. For example, in other embodiments of the present disclosure not shown in the drawings, the first expansion joints J1 can be of different structures.

In the present embodiment, along the transverse direction D, the uneven surface of the first supporting pillar 122 partially overlaps with the uneven surface of the second supporting pillar 222. Accordingly, the relative position or the assembling of the first supporting pillar 122 and the second supporting pillar 222 can be limited relative to each other along the transverse direction D so as to have an effect of structural alignment, thereby effectively preventing a misalignment or a disconnection of the first supporting pillar 122 and the second supporting pillar 222 from occurring.

In other words, a thickness of the first buffering conductor 4 should be controlled to enable the uneven surface of the first supporting pillar 122 to partially overlap with the uneven surface of the second supporting pillar 222 along the transverse direction D. Moreover, the transverse direction D in the present embodiment can be any direction perpendicular to the thickness direction H.

Specifically, a CTE of the first buffering conductor 4 is less than a CTE of the first inner metal layer 12 (e.g., 16-17) and is less than a CTE of the first inner metal layer 12 (e.g., 16-17), and the CTE of the first buffering conductor 4 is preferably less than or equal to 250% of the chip CTE. Accordingly, the first buffering conductor 4 is provided with a stress buffering function, an electrically conductive function, and a transmission function for effectively improving connection issues between any two components (e.g., a delamination defect, a peeling defect, or a crack defect) due to thermal expansion and contraction. For example, the first buffering conductor 4 can be made of a material including at least one of aluminum silicon carbide (AlSiC), aluminum-silicon (Al—Si) alloy, molybdenum (Mo), tungsten (W), copper-molybdenum (Cu—Mo) alloy, copper-tungsten (Cu—W) alloy, and other conductive materials, but the present disclosure is not limited thereto.

Each of the chips 3 and the corresponding positioning region 221 are connected through the buffering conductive layer 5. The buffering conductive layer 5 in the present embodiment includes a plurality of buffering regions 51 spaced apart from each other, and each of the chips 3 and the corresponding positioning region 221 are connected through at least one of the buffering regions 51.

The buffering conductive layer 5 is spaced apart from the first board 1 along the thickness direction H by an arrangement distance H5, and a distance between the first buffering conductor 4 and the first board 1 is within a range from 95% to 105% of the arrangement distance H5. In other words, the buffering conductive layer 5 in the present embodiment can be substantially located in a space defined by virtually extending the expansion joint J1 along a direction perpendicular to the thickness direction H.

Specifically, a CTE of the buffering conductive layer 5 is less than the CTE of the second inner metal layer 22, and the CTE of the buffering conductive layer 5 is greater than the chip CTE (and is preferably less than or equal to 250% of the chip CTE). Accordingly, the buffering conductive layer 5 is provided with a stress buffering function, an electrically conductive function, and a transmission function for effectively improving connection issues between any two components (e.g., a delamination defect, a peeling defect, or a crack defect) due to thermal expansion and contraction.

The material of the buffering conductive layer 5 in the present embodiment is preferably identical to that of the first buffering conductor 4, thereby facilitating the manufacturing of the dual-side heat-dissipation package structure 100, but the present disclosure is not limited thereto. For example, the material of the first buffering conductor 4 and the material of the buffering conductive layer 5 can be any two of aluminum silicon carbide (AlSiC), aluminum-silicon (Al—Si) alloy, molybdenum (Mo), tungsten (W), copper-molybdenum (Cu—Mo) alloy, copper-tungsten (Cu—W) alloy, and other conductive materials, but the present disclosure is not limited thereto.

The metal piece 7 in the present embodiment is an elongated pin and has a first segment 71 and a second segment 72 that extends from the first segment 71. The first segment 71 faces toward the connection region 123 along the thickness direction H, and the first segment 71 and the connection region 123 have uneven surfaces that are complementary in shape with each other and that have a second gap therebetween.

The second buffering conductor 6 is arranged in the second gap and connects the first segment 71 and the connection region 123 so as to be jointly defined as a second expansion joint J2. Moreover, along the transverse direction D, the uneven surface of the connection region 123 partially overlaps with the uneven surface of the metal piece 7 so as to have an effect of structural alignment, thereby effectively preventing a misalignment or a disconnection of the connection region 123 and the metal piece 7 from occurring. In other words, a thickness of the second buffering conductor 6 should be controlled to enable the uneven surface of the connection region 123 to partially overlap with the uneven surface of the metal piece 7 along the transverse direction D.

Specifically, a CTE of the second buffering conductor 6 is less than the CTE of the first inner metal layer 12 and is less than a CTE of the metal piece 7 (e.g., 16-17), and the CTE of the second buffering conductor 6 is preferably less than or equal to 250% of the chip CTE. Accordingly, the second buffering conductor 6 is provided with a stress buffering function, an electrically conductive function, and a transmission function for effectively improving connection issues between any two components (e.g., a delamination defect, a peeling defect, or a crack defect) due to thermal expansion and contraction.

In the present embodiment, the material of the second buffering conductor 6 in the present embodiment is preferably identical to that of any one of the first buffering conductor 4 and the buffering conductive layer 5, thereby facilitating the manufacturing of the dual-side heat-dissipation package structure 100, but the present disclosure is not limited thereto. For example, the material of the second buffering conductor 6, the material of the first buffering conductor 4, and the material of the buffering conductive layer 5 can be at least two of aluminum silicon carbide (AlSiC), aluminum-silicon (Al—Si) alloy, molybdenum (Mo), tungsten (W), copper-molybdenum (Cu—Mo) alloy, copper-tungsten (Cu—W) alloy, and other conductive materials, but the present disclosure is not limited thereto.

It should be noted that the structure and connection relationship of the first inner metal layer 12, the metal piece 7, and the second buffering conductor 6 in the present embodiment are in cooperation with the above components and are applied in the dual-side heat-dissipation package structure 100, but the present disclosure is not limited thereto. For example, the structure and connection relationship of the first inner metal layer 12, the metal piece 7, and the second buffering conductor 6 can be independently applied in other package structures.

The first inner metal layer 12, the second inner metal layer 22, each of the chips 3, each of the first buffering conductors 4 (or each of the first expansion joints J1), the buffering conductive layer 5, the second buffering conductor 6 (or the second expansion joint J2), and the first segment 71 of the metal piece 7 are embedded in the encapsulant 8.

Moreover, an outer lateral edge of the first outer metal layer 13 and an outer lateral edge of the second outer metal layer 23 are covered by (or embedded in) the encapsulant 8, and an outer surface of the first outer metal layer 13 and an outer surface of the second outer metal layer 23 are exposed from the encapsulant 8. The second segment 72 of the metal piece 7 passes through the encapsulant 8 for being soldered or fixed to an external component (not shown in the drawings).

In addition, the structural features of the dual-side heat-dissipation package structure 100 of the present embodiment are described in the above description, and the following description briefly describes a manufacturing process of the dual-side heat-dissipation package structure 100.

Figure 4:
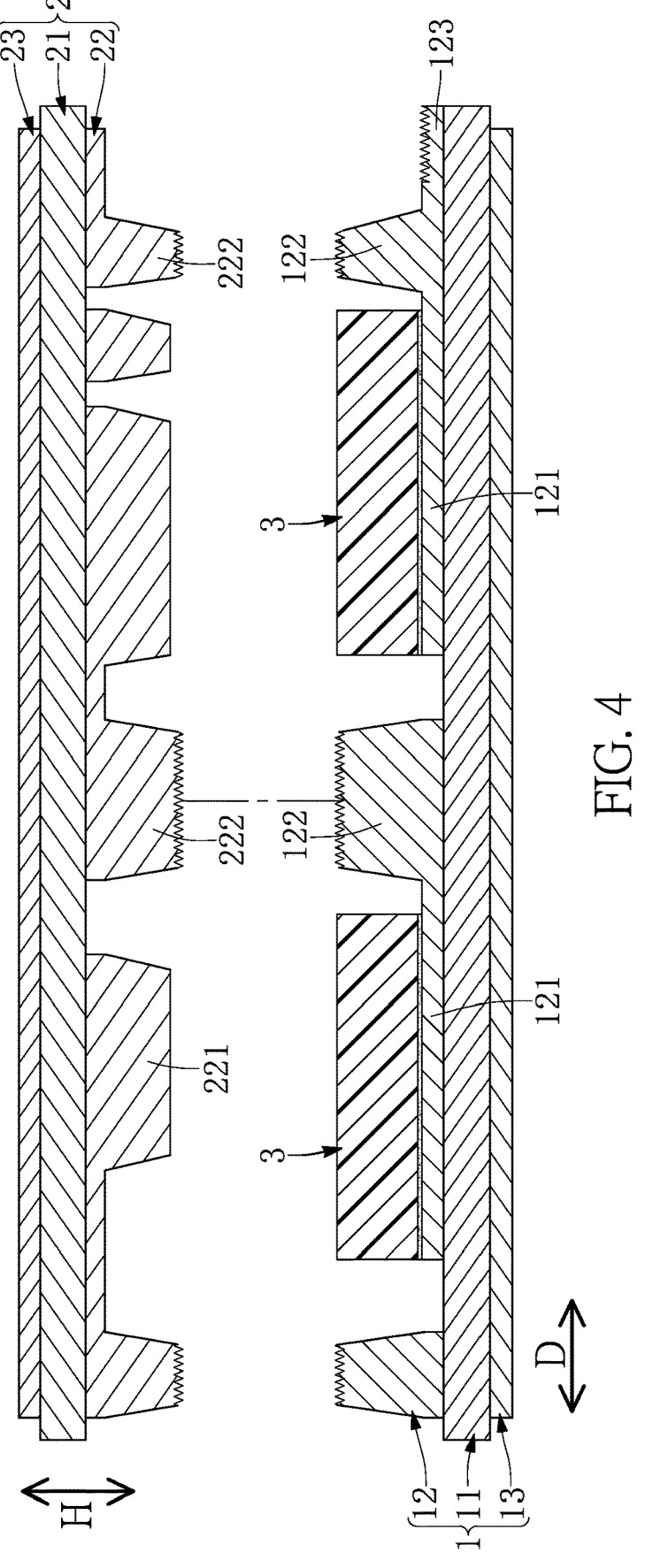
FIG. 4 is a schematic cross-sectional view showing a first manufacturing step of the dual-side heat-dissipation package structure of FIG. 1.

As shown in FIG. 4, the first inner metal layer 12 of the first heat-dissipation board 1 and the second inner metal layer 22 of the second heat-dissipation board 2 are respectively formed with two patterned surfaces in an etching manner and/or an electroplating manner. The two patterned surfaces correspond in position or shape to each other and have the chip-bonding regions 121, the first supporting pillars 122, the connection region 123, the positioning regions 221, and the second supporting pillars 222.

Figure 3:
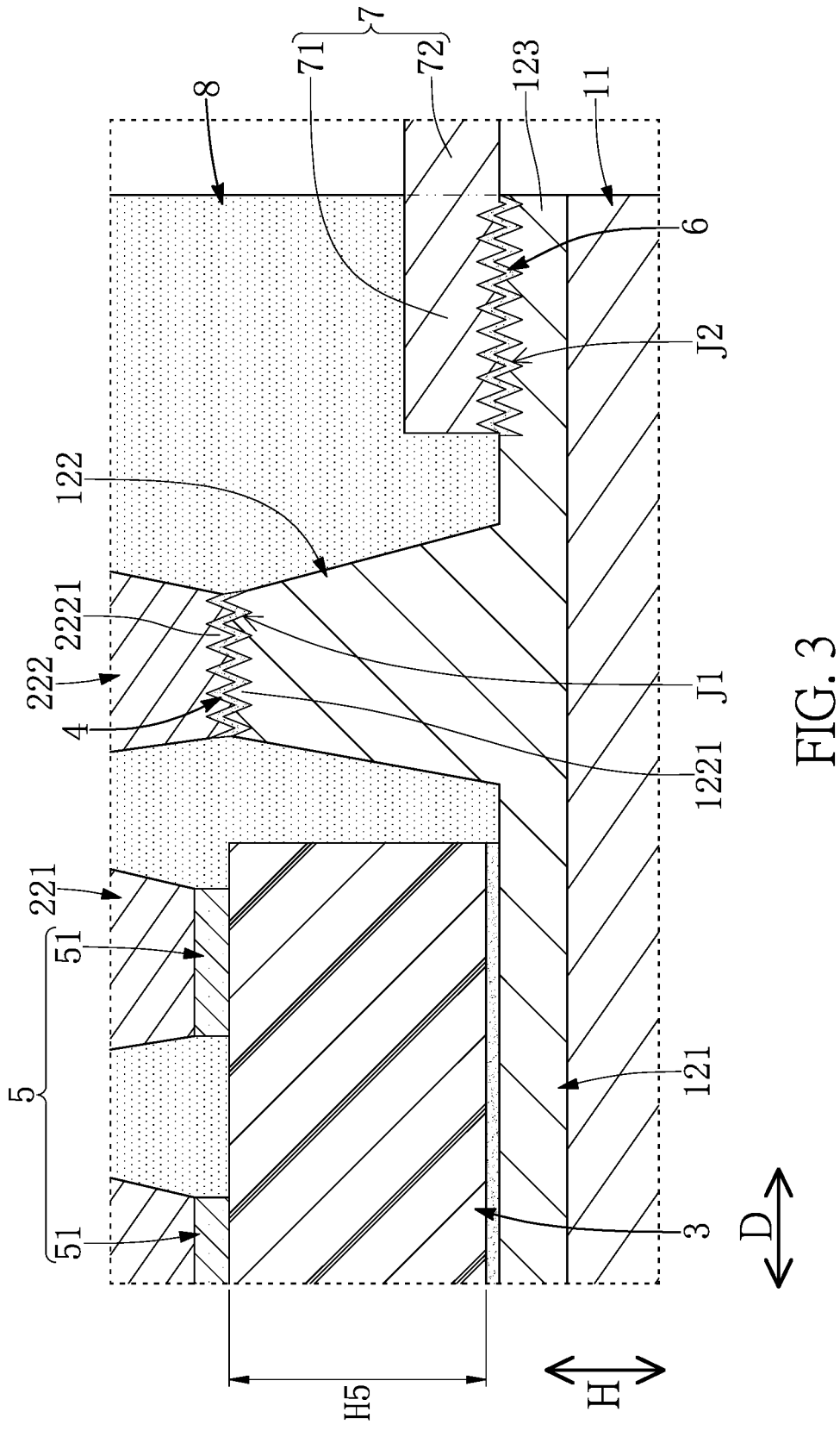
FIG. 3 is a schematic enlarged view of part III of FIG. 2.
Figure 5:
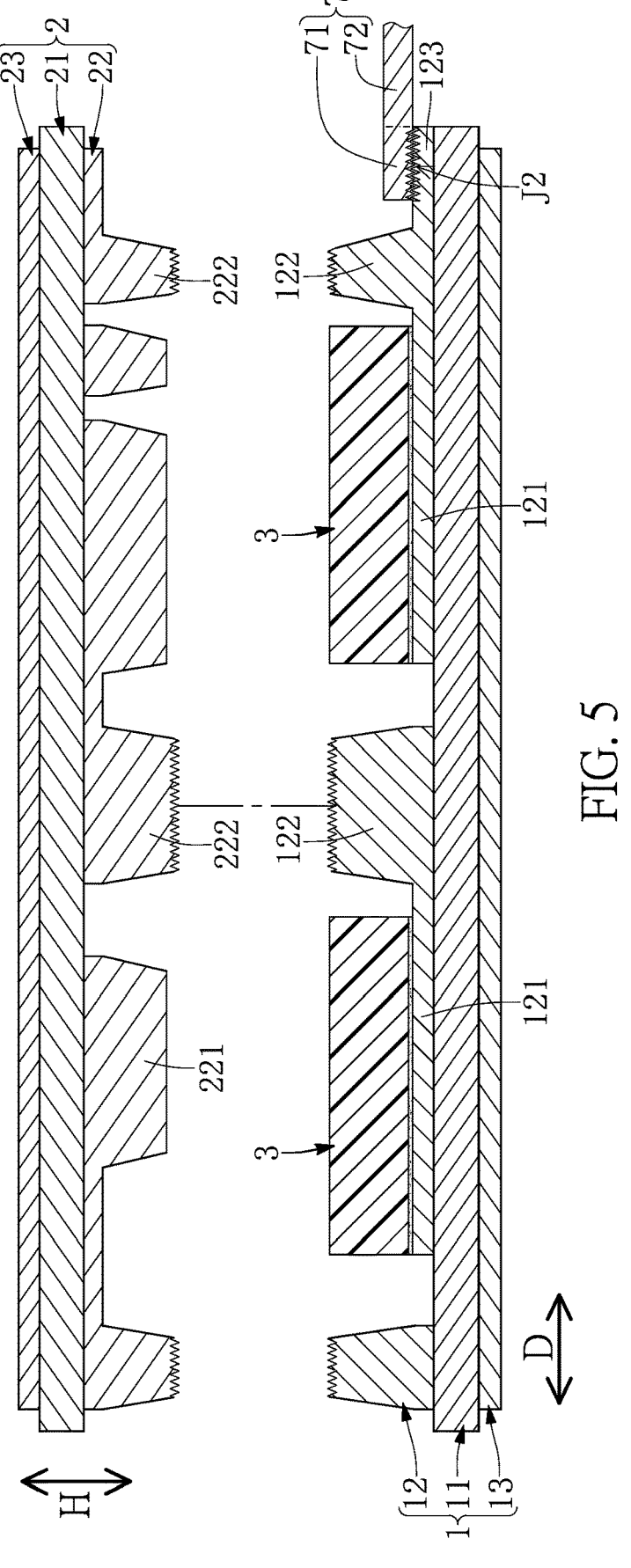
FIG. 5 is a schematic cross-sectional view showing a second manufacturing step of the dual-side heat-dissipation package structure of FIG. 1.
Figure 6:
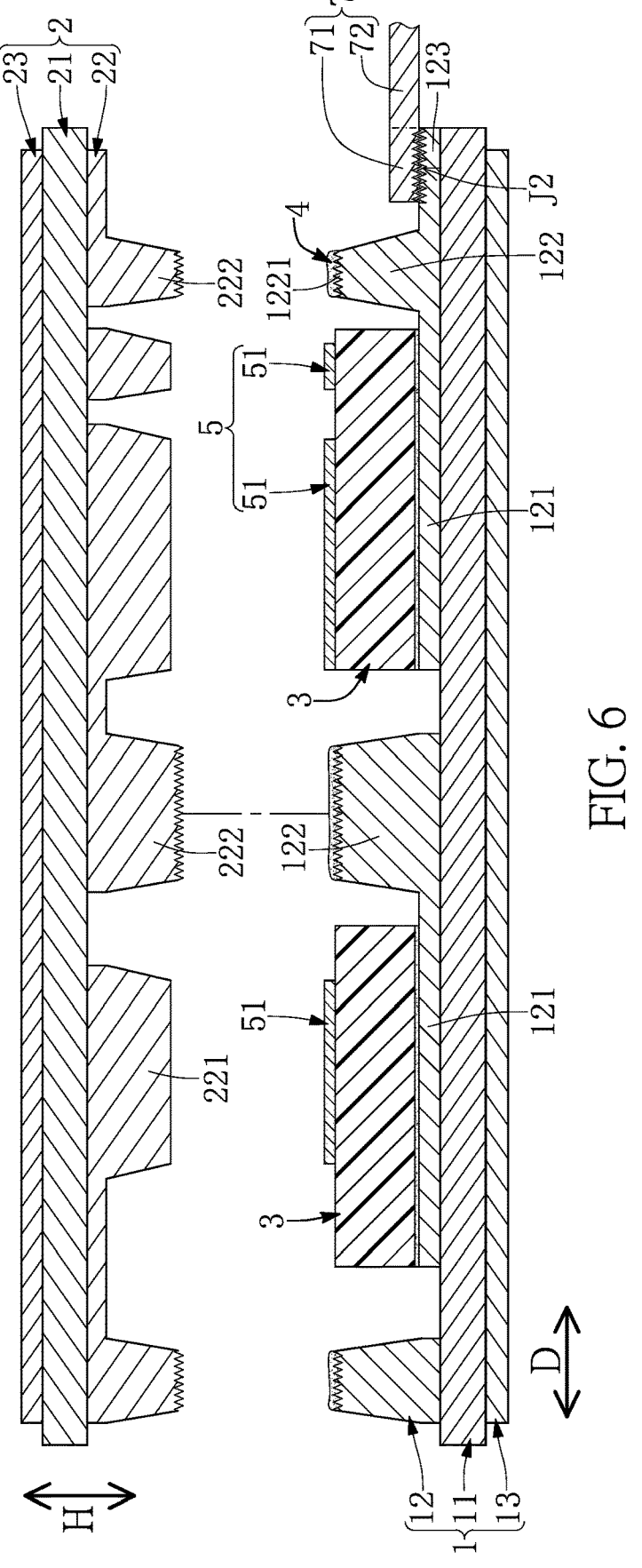
FIG. 6 is a schematic cross-sectional view showing a third manufacturing step of the dual-side heat-dissipation package structure of FIG. 1.
Figure 7:
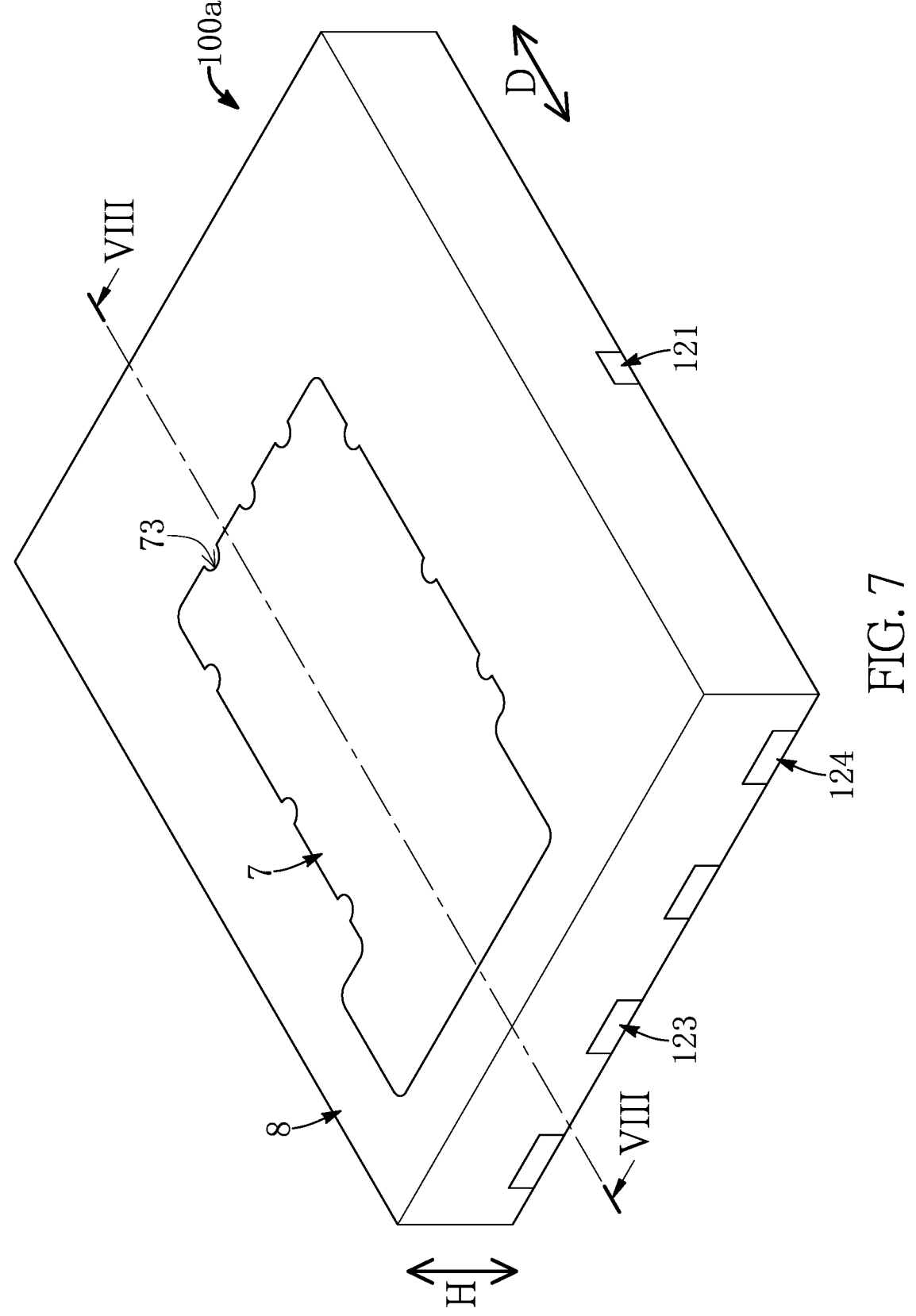
FIG. 7 is a schematic perspective view of a package structure according to a second embodiment of the present disclosure.
Figure 8:
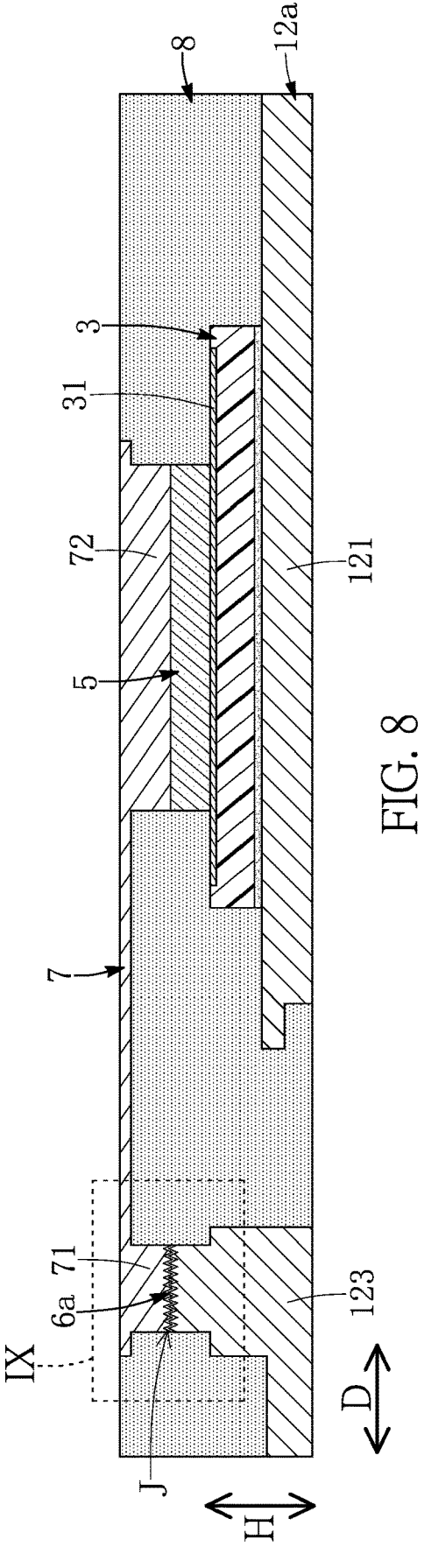
FIG. 8 is a schematic cross-sectional view taken along line VIII-VIII of FIG. 7.
Figure 9:
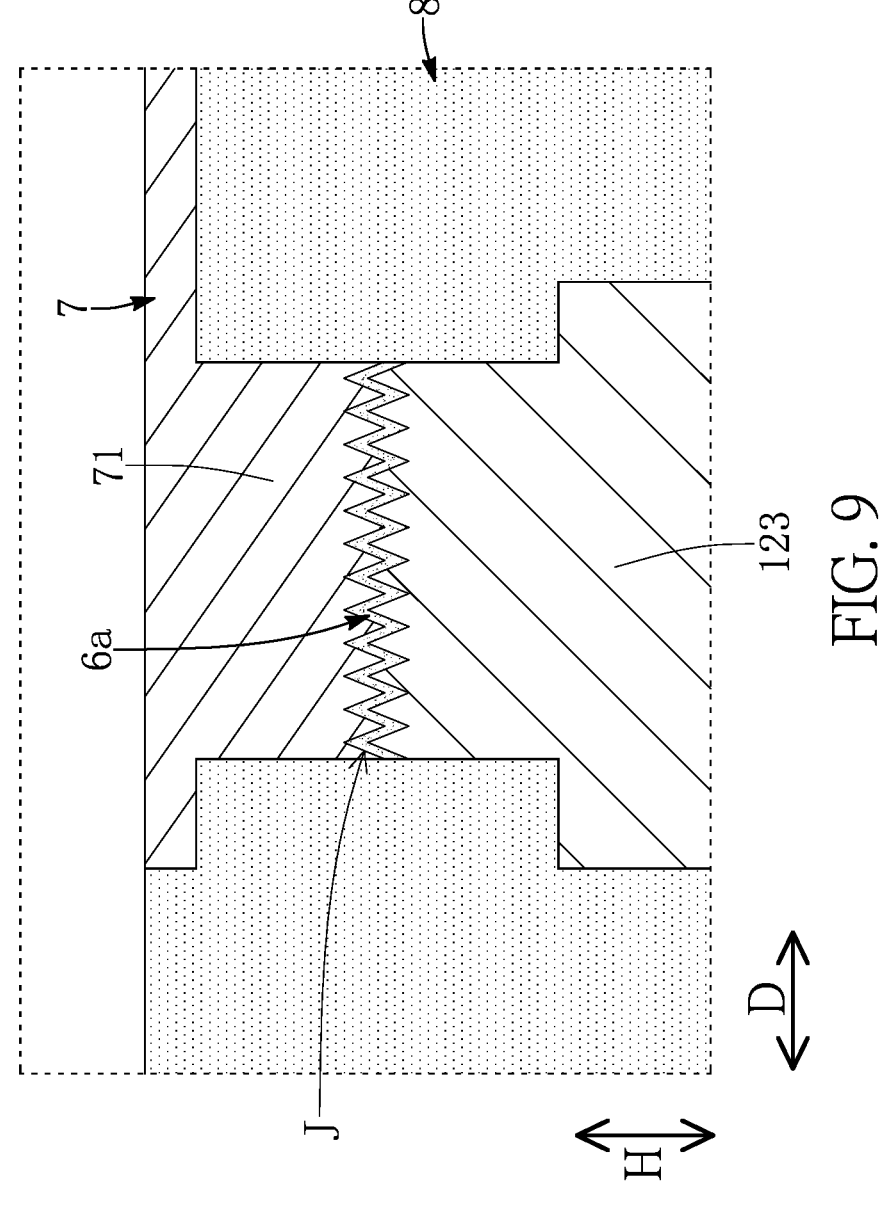
FIG. 9 is a schematic enlarged view of part IX of FIG. 8.
Figure 10:
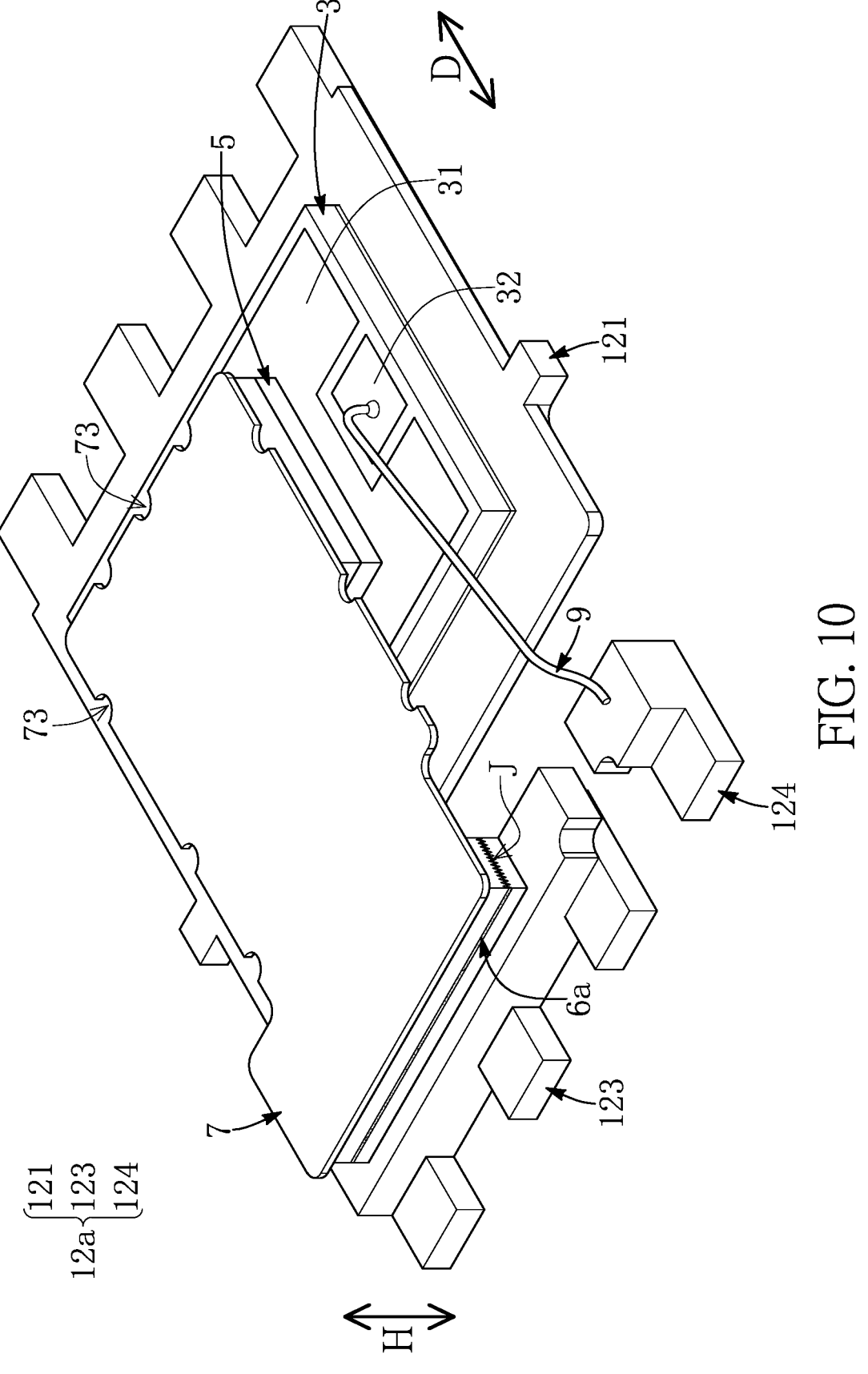
FIG. 10 is a schematic perspective view showing the package structure of FIG. 7 with an encapsulant being omitted.

As shown in FIG. 5, the chips 3 are respectively assembled to the chip-bonding regions 121 of the first heat-dissipation board 1, and the first segment 71 of the metal piece 7 is connected to the connection segment 123 through the second buffering conductor 6 (as shown in FIG. 3) so as to form the second expansion joint J2. As shown in FIG. 6, the first buffering conductors 4 are respectively disposed on the ends 1221 of the first supporting pillars 122, and the buffering conductive layer 5 is disposed on the chips 3.

Figure 2:
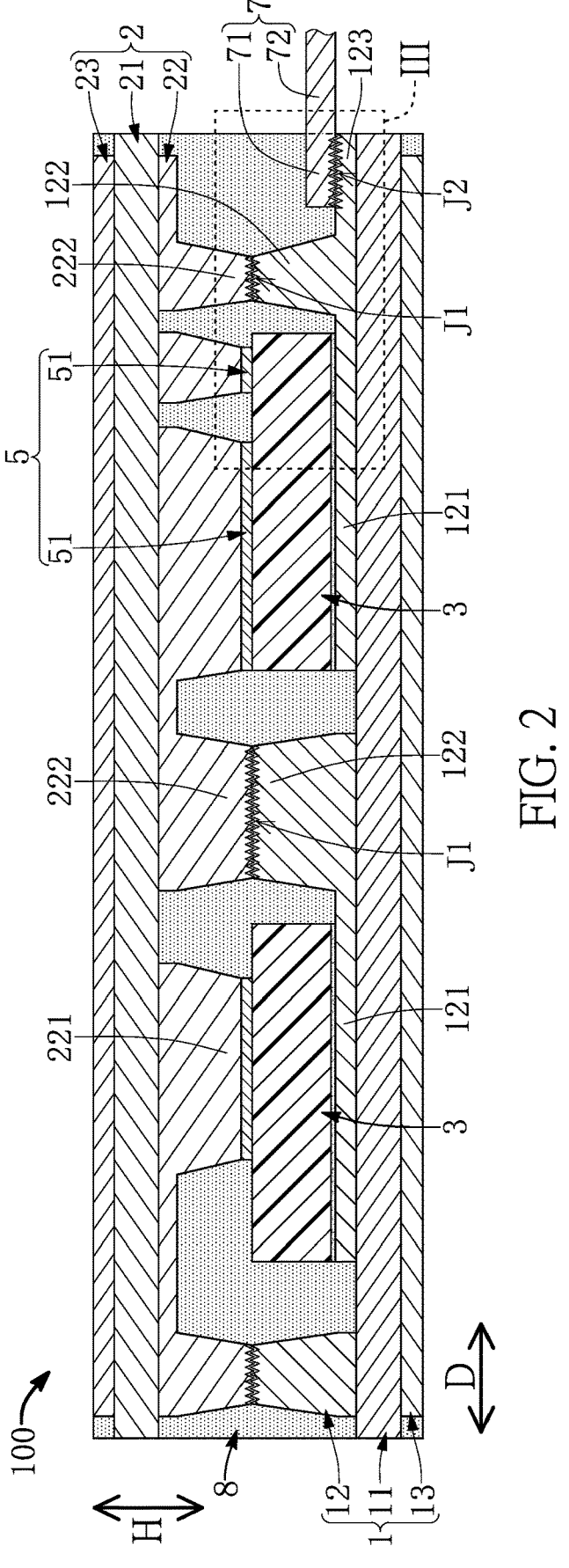
FIG. 2 is a schematic cross-sectional view taken along line II-II of FIG. 1.

As shown in FIG. 2, the positioning regions 221 of the second heat-dissipation board 2 are connected to the buffering conductive layer 5, and then the second supporting pillars 222 of the second heat-dissipation board 2 are respectively connected to the first buffering conductors 4 so as to form the first expansion joints J1. After that, the encapsulant 8 is formed on the first heat-dissipation board 1 and the second heat-dissipation board 2, and the first inner metal layer 12, the second inner metal layer 22, and the chips 3 are embedded in the encapsulant 8.

Second Embodiment

Referring to FIG. 7 to FIG. 10, a second embodiment of the present disclosure, which is similar to the first embodiment of the present disclosure, is provided. For the sake of brevity, descriptions of the same components in the first and second embodiments of the present disclosure will be omitted herein, and the following description only discloses different features between the first and second embodiments.

The present embodiment provides a package structure 100a, which includes a metal layer 12a, a chip 3 disposed on the metal layer 12a, a buffering conductor 6a disposed on the metal layer 12a, a buffering conductive layer 5 disposed on the chip 3, a metal piece 7 electrically coupled to the metal layer 12a and the chip 3, a metal wire 9 electrically coupled to the metal layer 12a and the chip 3, and an encapsulant 8 that is formed on the metal layer 12a, but the present disclosure is not limited thereto. For example, the structure and the connection relationship of the metal layer 12a, the buffering conductor 6a, and the metal piece 7 can be independently applied to other package structures.

The metal layer 12a of the present embodiment includes a chip-bonding region 121, a connection region 123, and a wiring region 124. The chip-bonding region 121, the connection region 123, and the wiring region 124 are spaced apart from each other, and the connection region 123 and the wiring region 124 are located at a same side of the chip-bonding region 121. Moreover, the chip 3 is disposed on the chip-bonding region 121 and is preferably connected to the chip-bonding region 121 through a conductive adhesive (not labeled in the drawings), but the present disclosure is not limited thereto.

The metal piece 7 has a first segment 71 and a second segment 72 that is opposite to the first segment 71. The first segment 71 is spaced apart from and faces toward the connection region 123 along a thickness direction H, and the second segment 72 is connected to the chip 3. The chip 3 and the second segment 72 are connected through the buffering conductive layer 5.

In the present embodiment, the chip 3 has a first connection pad 31 and a second connection pad 32 that is spaced apart from the first connection pad 31. The buffering conductive layer 5 is disposed on the first connection pad 31, and the wiring region 124 and the second connection pad 32 are connected through the metal wire 9. In other words, the wiring region 124 of the metal layer 12a and the second connection pad 32 of the chip 3 are electrically coupled to each other through the metal wire 9.

Specifically, the first segment 71 of the metal piece 7 and the connection region 123 of the metal layer 12a have uneven surfaces that are complementary in shape with each other and that have a gap therebetween. Moreover, along a transverse direction D perpendicular to the thickness direction H, the uneven surface of the connection region 123 partially overlaps with the uneven surface of the metal piece 7.

Furthermore, the buffering conductor 6a is arranged in the gap and connects the first segment 71 and the connection region 123 so as to be jointly defined as an expansion joint J. Accordingly, the chip 3 in the present embodiment can be electrically coupled to the connection region 123 through the buffering conductive layer 5, the metal piece 7, and the buffering conductor 6a.

Specifically, a CTE of the buffering conductor 6a is less than a CTE of the metal layer 12a and is less than a CTE of the metal piece 7, and the CTE of the buffering conductor 6a is preferably less than or equal to 250% of a chip CTE of the chip 3. Accordingly, the buffering conductor 6a is provided with a stress buffering function, an electrically conductive function, and a transmission function for effectively improving connection issues between any two components (e.g., a delamination defect, a peeling defect, or a crack defect) due to thermal expansion and contraction. For example, the buffering conductor 6a can be made of a material including at least one of aluminum silicon carbide (AlSiC), aluminum-silicon (Al—Si) alloy, molybdenum (Mo), tungsten (W), copper-molybdenum (Cu—Mo) alloy, copper-tungsten (Cu—W) alloy, and other conductive materials, but the present disclosure is not limited thereto.

In addition, an inner surface of the metal layer 12a, the chip 3, the buffering conductive layer 5, the buffering conductor 6a (or the expansion joint J), an inner surface of the metal piece 7, and the metal wire 9 are embedded in the encapsulant 8. Moreover, an outer surface of the metal layer 12a and an outer surface of the metal piece 7 are exposed from the encapsulant 8. In the present embodiment, the metal piece 7 preferably has a plurality of notches 73 that are recessed in an outer lateral edge thereof and that are fully filled with the encapsulant 8, thereby increasing a combination strength between the metal piece 7 and the encapsulant 8.

Third Embodiment

Figure 11:
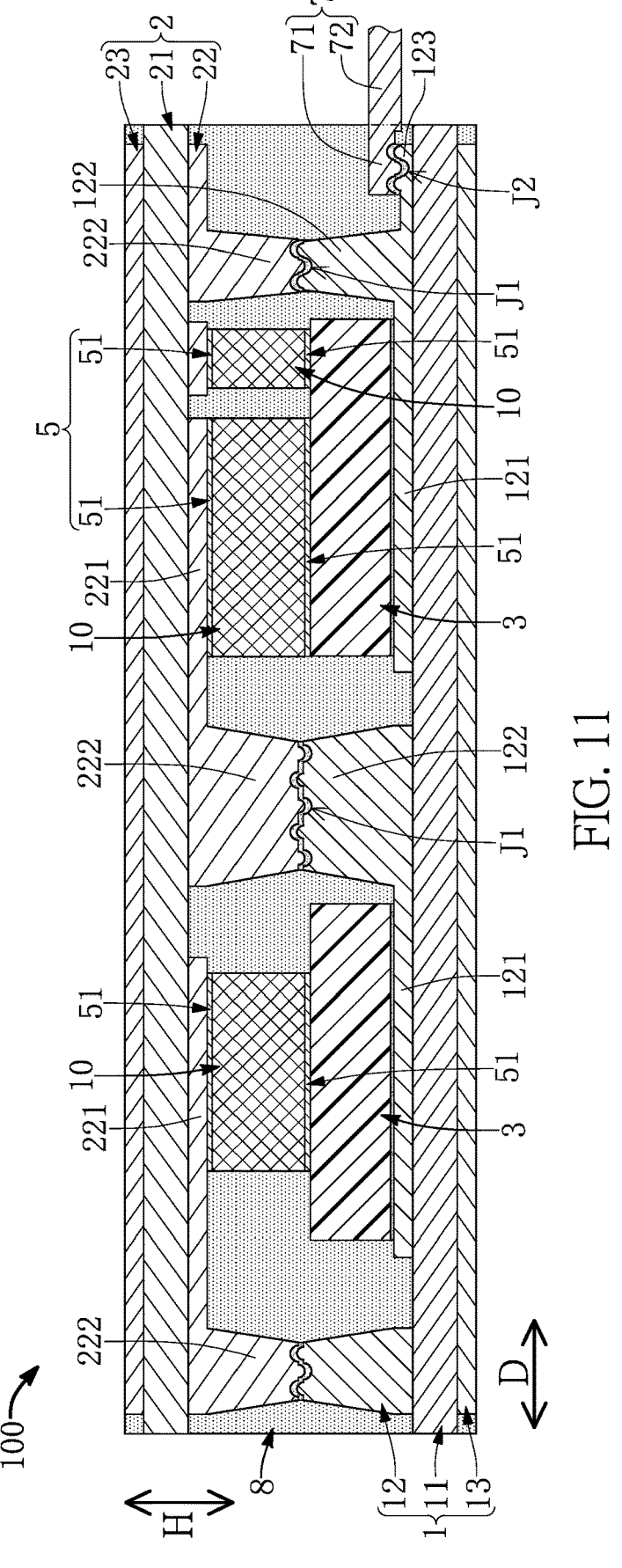
FIG. 11 is a schematic cross-sectional view of the dual-side heat-dissipation package structure according to a third embodiment of the present disclosure.
Figure 12:
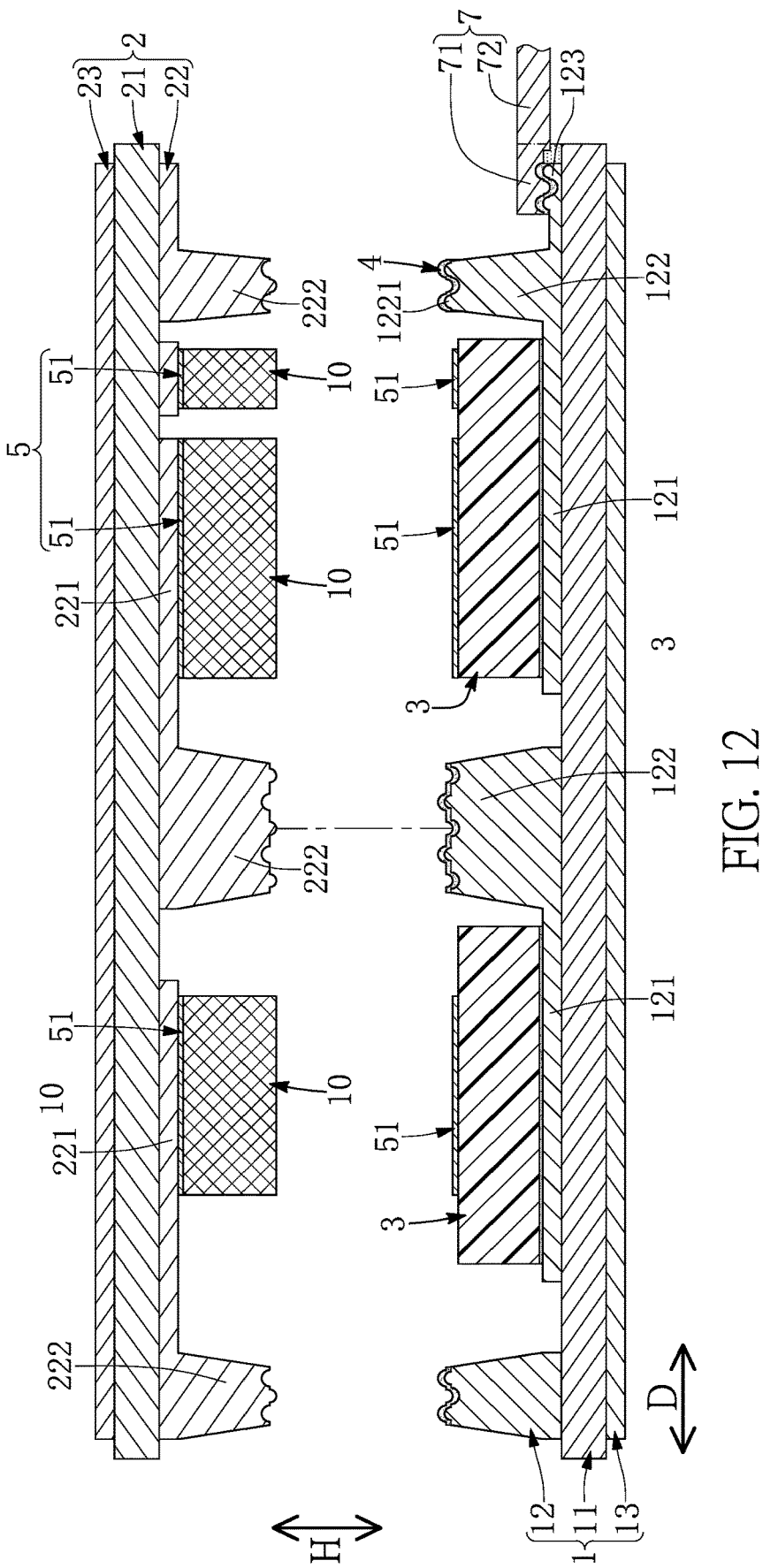
FIG. 12 is a schematic exploded view of FIG. 11 with the encapsulant being omitted.

Referring to FIG. 11 and FIG. 12, a third embodiment of the present disclosure, which is similar to the first embodiment of the present disclosure, is provided. For the sake of brevity, descriptions of the same components in the first and third embodiments of the present disclosure will be omitted herein, and the following description only discloses different features between the first and third embodiments.

In the present embodiment, the dual-side heat-dissipation package structure 100 further includes a plurality of spacers 10. Each of the chips 3 is provided with at least one of the spacers 10 disposed thereon, so that each of the chips 3 and the corresponding spacer 10 are jointly sandwiched between the first heat-dissipation board 1 (e.g., the chip-bonding region 121) and the second heat-dissipation board 2 (e.g., the positioning region 221).

Specifically, each of the spacers 10 in the present embodiment has conductivity, and two ends of each of the spacers 10 are respectively connected to the chip 3 and the positioning region 221 of the second heat-dissipation board 2 through two of the buffering regions 51 of the buffering conductive layer 5, but the present disclosure is not limited thereto.

Beneficial Effects of the Embodiments

In conclusion, two corresponding components arranged in the dual-side heat-dissipation package structure (or the package structure) and connected to each other, which are provided by the present disclosure, have uneven surfaces that are complementary in shape with each other and are connected through the buffering conductor having a specific CTE, such that the buffering conductor can be provided with a stress buffering function, an electrically conductive function, and a transmission function for effectively improving connection issues between the two corresponding components (e.g., a delamination defect, a peeling defect, or a crack defect) due to thermal expansion and contraction.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A dual-side heat-dissipation package structure, comprising:
   a first heat-dissipation board including a first board and a first inner metal layer that is disposed on an inner side of the first board, wherein the first inner metal layer includes at least one chip-bonding region and at least one first supporting pillar;
   at least one chip disposed on the at least one chip-bonding region;
   a second heat-dissipation board including a second board and a second inner metal layer that is disposed on an inner side of the second board, wherein the second inner metal layer includes:
      at least one positioning region, wherein the at least one chip is sandwiched between the at least one positioning region and the at least one chip-bonding region; and
      at least one second supporting pillar having an end that is spaced apart from and faces toward an end of the at least one first supporting pillar along a thickness direction, wherein the end of the at least one first supporting pillar and the end of the at least one second supporting pillar have uneven surfaces that are complementary in shape with each other and that have a first gap therebetween; and
   at least one first buffering conductor that is arranged in the first gap and that connects the end of the at least one first supporting pillar and the end of the at least one second supporting pillar so as to be jointly defined as at least one first expansion joint, wherein the at least one first buffering conductor has a coefficient of thermal expansion (CTE) that is less than a CTE of the first inner metal layer and that is less than a CTE of the second inner metal layer.

2. The dual-side heat-dissipation package structure according to claim 1, wherein, along a transverse direction perpendicular to the thickness direction, the uneven surface of the at least one first supporting pillar partially overlaps with the uneven surface of the at least one second supporting pillar.

3. The dual-side heat-dissipation package structure according to claim 1, further comprising an encapsulant formed on the first board and the second board, wherein the first inner metal layer, the second inner metal layer, the at least one chip, and the at least one first expansion joint are embedded in the encapsulant.

4. The dual-side heat-dissipation package structure according to claim 3, wherein the first heat-dissipation board includes a first outer metal layer disposed on an outer side of the first board, the second heat-dissipation board includes a second outer metal layer disposed on an outer side of the second board, and an outer surface of the first outer metal layer and an outer surface of the second outer metal layer are exposed from the encapsulant.

5. The dual-side heat-dissipation package structure according to claim 1, wherein each of the first heat-dissipation board and the second heat-dissipation board is a direct bonded copper (DBC) ceramic substrate, and wherein each of the first board and the second board is a ceramic board, the first inner metal layer is sintered and fixed to the first board, and the second inner metal layer is sintered and fixed to the second board.

6. The dual-side heat-dissipation package structure according to claim 1, wherein each of the first heat-dissipation board and the second heat-dissipation board is an active metal brazing (AMB) ceramic substrate, and wherein each of the first board and the second board is a ceramic board, the first inner metal layer is brazed and fixed to the first board, and the second inner metal layer is brazed and fixed to the second board.

7. The dual-side heat-dissipation package structure according to claim 1, wherein a quantity of the at least one first expansion joint is more than one, a quantity of the at least one chip is more than one, and any two of the chips adjacent to each other are provided with one of the first expansion joints therebetween along a transverse direction perpendicular to the thickness direction.

8. The dual-side heat-dissipation package structure according to claim 1, further comprising a buffering conductive layer connected in-between the at least one chip and the at least one positioning region, wherein the at least one chip has a chip CTE, and a CTE of the buffering conductive layer is less than the CTE of the second inner metal layer and is greater than the chip CTE.

9. The dual-side heat-dissipation package structure according to claim 8, wherein the buffering conductive layer is spaced apart from the first board along the thickness direction by an arrangement distance, and a distance between the at least one first buffering conductor and the first board is within a range from 95% to 105% of the arrangement distance.

10. The dual-side heat-dissipation package structure according to claim 1, wherein the at least one chip has a chip CTE, and the CTE of the first buffering conductor is less than or equal to 250% of the chip CTE.

11. The dual-side heat-dissipation package structure according to claim 1, wherein the at least one first buffering conductor is made of a material including at least one of aluminum silicon carbide (AlSiC), aluminum-silicon (Al—Si) alloy, molybdenum (Mo), tungsten (W), copper-molybdenum (Cu—Mo) alloy, and copper-tungsten (Cu—W) alloy.

12. The dual-side heat-dissipation package structure according to claim 1, wherein the first inner metal layer includes a connection region, the dual-side heat-dissipation package structure further includes:

a metal piece having a first segment that faces toward the connection region along the thickness direction, wherein the first segment and the connection region have uneven surfaces that are complementary in shape with each other and that have a second gap therebetween; and a second buffering conductor that is arranged in the second gap and that connects the first segment and the connection region so as to be jointly defined as a second expansion joint, wherein the second buffering conductor has a CTE that is less than the CTE of the first inner metal layer and that is less than a CTE of the metal piece;

wherein, along a transverse direction perpendicular to the thickness direction, the uneven surface of the connection region partially overlaps with the uneven surface of the metal piece.

13. A dual-side heat-dissipation package structure, comprising:

two heat-dissipation boards spaced apart from each other along a thickness direction and respectively having two supporting pillars, wherein ends of the two supporting pillars are spaced apart from and face toward each other along the thickness direction, and the ends of the two supporting pillars have uneven surfaces that are complementary in shape with each other and that have a gap therebetween;

a chip arranged between the two heat-dissipation boards and having a chip coefficient of thermal expansion (CTE); and a buffering conductor that is arranged in the gap and that connects the ends of the two supporting pillars so as to be jointly defined as an expansion joint, wherein the buffering conductor has a CTE that is less than or equal to 250% of the chip CTE.

14. The dual-side heat-dissipation package structure according to claim 13, further comprising a spacer disposed on the chip, wherein the spacer and the chip are sandwiched between the two heat-dissipation boards.

15. A package structure, comprising:

a metal layer including a connection region;

a metal piece having a first segment that faces toward the connection region along a thickness direction, wherein the first segment and the connection region have uneven surfaces that are complementary in shape with each other and that have a gap therebetween; and a buffering conductor that is arranged in the gap and that connects the first segment and the connection region so as to be jointly defined as an expansion joint, wherein the buffering conductor has a coefficient of thermal expansion (CTE) that is less than a CTE of the metal layer and that is less than a CTE of the metal piece.

16. The package structure according to claim 15, further comprising an encapsulant formed on the metal layer, wherein the expansion joint is embedded in the encapsulant.

17. The package structure according to claim 16, wherein, along a transverse direction perpendicular to the thickness direction, the uneven surface of the connection region partially overlaps with the uneven surface of the metal piece.

18. The package structure according to claim 16, wherein the metal layer includes a chip-bonding region spaced apart from the connection region, and the package structure further includes a chip disposed on the chip-bonding region and embedded in the encapsulant, wherein the chip has a chip CTE, and the CTE of the buffering conductor is less than or equal to 250% of the chip CTE, and wherein the metal piece has a second segment that is connected to the chip and that has an inner side embedded in the encapsulant.

19. The package structure according to claim 18, further comprising a buffering conductive layer that connects the chip and the second segment, wherein the chip is electrically coupled to the connection region through the buffering conductive layer, the metal piece, and the buffering conductor.

20. The package structure according to claim 18, wherein the chip has a first connection pad and a second connection pad that is spaced apart from the first connection pad, the buffering conductive layer is disposed on the first connection pad, the metal layer includes a wiring region spaced apart from the connection region and the chip-bonding region, and the package structure further includes a metal wire that connects the wiring region and the second connection pad.

* * * * *